(12) United States Patent
Arz et al.

(10) Patent No.: US 7,053,744 B2
(45) Date of Patent: May 30, 2006

(54) ENCAPSULATION OF A MAGNETIC RESONANCE TOMOGRAPHY DEVICE FOR ATTENUATION OF LOW SOUND FREQUENCIES

(75) Inventors: Winfried Arz, Nürnberg (DE); Peter Dietz, Fürth (DE); Peter Distler, Möhrendorf (DE); Udo Franzke, Uttenreuth-Weiher (DE); Matthias Weber, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/510,597

(22) PCT Filed: Mar. 31, 2003

(86) PCT No.: PCT/DE03/01054

§ 371 (c)(1),
(2), (4) Date: Jun. 30, 2005

(87) PCT Pub. No.: WO03/087862

PCT Pub. Date: Oct. 23, 2003

(65) Prior Publication Data
US 2005/0258923 A1 Nov. 24, 2005

(30) Foreign Application Priority Data
Apr. 11, 2002 (DE) .............................. 102 15 986

(51) Int. Cl.
*H01F 5/00* (2006.01)
(52) U.S. Cl. ...................... 335/299; 335/216; 324/318; 324/319
(58) Field of Classification Search ................ 335/216, 335/296–299; 324/318–320
See application file for complete search history.

(56) References Cited

U.S. PATENT DOCUMENTS 5,084,676 A 1/1992 Sabo et al.
6,469,510 B1 * 10/2002 Drobnitzky ................. 324/318

FOREIGN PATENT DOCUMENTS

| DE | OS 198 38 390 | 3/2000 |
| EP | 0 350 640 | 1/1990 |
| EP | 1 077 382 | 2/2001 |
| EP | 1 193 507 | 4/2002 |

OTHER PUBLICATIONS

Patent Abstracts of Japan Publication No. 200232966, for Japanese Application No. 11035942.
Patent Abstracts of Japan Publication No. 09299348, for Japanese Application No. 08117522.
Patent Abstracts of Japan Publication No. 2001036282, for Japanese Application No. 11206068.

* cited by examiner

*Primary Examiner*—Ramon M. Barrera
(74) *Attorney, Agent, or Firm*—Schiff Hardin LLP

(57) ABSTRACT

A magnetic resonance tomography device, wherein vibrations of device components, particularly in the low frequency range, are attenuated, as a magnet body surrounded by a magnet shell, which surrounds and defines an inner area. A gradient coil system is disposed in the inner area and an inner encapsulation cylinder also is disposed therein. The magnetic shell and the gradient coil system are externally and acoustically sealed from the inner encapsulation cylinder, and from a capsule. The capsule is formed as a three-layer system, including a cover layer, a full foam layer and a partial foam layer.

26 Claims, 6 Drawing Sheets

ENCAPSULATION OF A MAGNETIC RESONANCE TOMOGRAPHY DEVICE FOR ATTENUATION OF LOW SOUND FREQUENCIES

BACKGROUND OF THE INVENTION

1. Field of the Invention

The present invention relates generally to magnetic resonance tomography (MRT) used in medicine to examine patients. The present invention relates especially to a magnetic resonance tomography device, wherein vibrations of device components especially in the low frequency range are attenuated by encapsulation of the MRT device.

2. Description of the Prior Art

MRT is based on the physical phenomenon of nuclear magnetic resonance and has been used successfully as an imaging method in medicine and biophysics for more than 15 years. With this examination method the subject is exposed to a powerful and constant magnetic field. As a result, the previously random nuclear spins of the atoms in the subject are aligned. Radio frequency energy can now stimulate these "ordered" nuclear spins to a specific vibration. This oscillation generates the actual measurement signal in MRT and this is detected by suitable receiver coils. The use of non-homogenous magnet fields, generated by gradient coils, allows the measurement object to be spatially coded in all three spatial directions. The technique allows free selection of the layer to be imaged, so sectional images of the human body can be recorded in all directions. MRT as a sectional imaging method in medical diagnostics is primarily characterized as a non-invasive examination method with a versatile contrast capability. MRT currently uses pulse sequences with a high-gradient capacity, which allow excellent imaging quality at measurement times of seconds and minutes.

The constant technical development of the components of MRT devices and the introduction of faster imaging sequences have opened up an increasing number of areas of use for MRT in medicine. Real-time imaging to assist with minimally invasive surgery, functional imaging in neurology and perfusion measurement in cardiology are just a few examples.

FIG. 8 shows a schematic section through an MRT device according to the prior art. The section shows further components of the inner area enclosed by the basic field magnet 1. The basic field magnet 1 contains superconducting magnet coils in liquid helium and is surrounded by a magnet shell 12 in the form of a twin-shell tank. The so-called cold head 15 outside the magnet shell 12 is responsible for keeping the temperature constant. In the inner area enclosed by the magnet shell 12 (also referred to as the magnet vessel) the gradient coil system 2 is suspended concentrically by means of carrier elements 7. The radio frequency resonator 13 (also called a body coil) is also inserted concentrically inside the gradient coil system 2. The radio frequency resonator 13 has the task of converting the RF pulses emitted by a power transmitter into a magnetic alternating field to stimulate the atomic nuclei of the patient 18, and then to convert the alternating field from the preceding nuclear moment into a voltage fed to the receiver link. The upper section of the radio frequency resonator 13 is connected mechanically via cladding 29 to the magnet shell 12. So-called tongues 30 are mounted in a contiguous manner on the lower section of the high-frequency resonator 13 by means of which the radio frequency resonator 13 is in turn connected mechanically via cladding 29 and by means of carrier elements 7 to the lower section of the magnet shell 12. The patient 18 is inserted into the opening or inner area of the system on a platform 19 movable on guide rails 17. The platform 19 is disposed on a vertically adjustable support frame 16.

The basic structure of the basic field magnet is shown respectively in FIG. 9. It shows the basic field magnet 1 (e.g. an axial superconducting air coil magnet with active shielding) that generates a homogenous magnetic basic field in an inner area. The superconducting magnet 1 internally has superconducting coils in liquid helium. The basic field magnet is surrounded by a twin-shell tank, generally made of high-grade steel. The inner tank containing the liquid helium, which also partly serves as a winding body for the magnet coils, is suspended by means of glass fiber reinforced plastic rods with low heat conductivity from the outer tank, which is at room temperature. There is a vacuum between the inner and outer tanks.

The cylindrical gradient coil system 2 is inserted concentrically into the inner area of the basic field magnet 1 by means of carrier elements 7. The body coil 13 is also concentrically inserted therein.

The gradient coil system 2 has three windings, which generate gradient fields spatially perpendicular to each other and proportional to the current in each winding. As shown in FIG. 10, the gradient coil system 2 includes an x-coil 3, a y-coil 4 and a z-coil 5, each of which is wound on a coil core 6, thereby generating respective gradient fields in the directions of the Cartesian coordinates x, y and z. Each of these coils is equipped with its own power supply in order to generate independent current pulses at the correct amplitude and time according to the sequence programmed in the pulse sequence controller. The currents required are around 250 A. As the gradient switching times should be as short as possible, current rise rates of around 250 kA/s are required. In an extraordinarily powerful magnet field, as is generated by the basic field magnet 1 (typically between 0.22 to 1.5 tesla), such switching processes are associated with significant mechanical vibration due to the Lorentz forces that arise. All system components linked mechanically to the gradient coil system 2 (housing, covers, basic field magnet tank or magnet shell, body coil BC, etc.) are stimulated to forced vibration.

Since the gradient coil system 2 is generally surrounded by conductive structures (e.g. high-grade steel magnet shell, conductive copper surfaces of the RF resonator), the pulsed fields trigger eddy currents therein, which interact with the basic magnet field 1 to exert forces on the aforementioned structures and also stimulate these structures to vibrate.

A further vibration source, which primarily causes the magnet vessel to vibrate, is the so-called cold head 6, which ensures that the temperature of the basic field magnet 1 is maintained. It is driven by a compressor and subjects the shell of the basic field magnet 1 to mechanical impact.

Vibration of the different MR components has a negative effect on the MR system in many ways:

1. An extremely high level of air-borne noise is generated, which is disturbing for the patient, the operating personnel and other people in the vicinity of the MR device.
2. The vibration of the gradient coil and the basic field magnet and the transmission of said vibration to the RF resonator in the inner area of the basic field magnet or the gradient coil is manifested in inadequate clinical image quality, which can even result in misdiagnosis (e.g. with functional imaging fMRI).

3. If the vibration of the magnet shell—i.e. the outer tank—is transmitted via the glass fiber reinforced plastic rods to the inner tank or the superconductor itself is stimulated to vibrate, a higher level of helium evaporation takes place—as with an ultrasonic atomizer— thereby incurring higher costs.

As already mentioned, most vibration or most noise originates in some way from the gradient coils (GC). The noise generated by the cold head is only 70 to 80 dB compared with 120 dB by the gradient coil, which transmits this much higher value in different ways to the magnet shell and the RF resonator.

To prevent transmission of the noise to the RF resonator or the copper eddy current surfaces representing such, various measures are known:

Firstly, the large surfaces of the copper film that are conventionally inserted relatively loosely in a carrier tube with a paper lattice structure were significantly reduced by "slots". Secondly these films were connected rigidly and permanently to the carrier tube so that only vibration of the carrier tube could also result in vibration of the copper conductive surfaces. Thirdly, vibration of the carrier tube was impeded by significantly increasing the mass of the carrier tube using other materials.

Despite these modifications further noise transmission still occurs from the gradient coil to the RF resonator and also to the magnet shell. There are essentially three transmission mechanisms, which are outlined below:

I. Switching the gradient coil causes eddy currents to be generated both in the magnet shell and in the RF resonator and the Lorentz forces of the eddy currents as before cause vibration in the magnet shell.

II. The gradient coil and RF resonator or magnet shell and gradient coil respectively represent two cylinders, one inside the other, the radial distance of which—in the form of an air gap—between magnet and the gradient coil system is approx. 1 cm and between and the body coil only approx. 3 cm. The gradient coil stimulates the air in this air gap to vibrate and the vibration is transmitted respectively to the magnet shell and the RF resonator.

III. The gradient coil is suspended concentrically in the opening of the magnet shell by means of carrier elements. Vibration of the gradient system is transmitted to the magnet shell via this mechanical support system. The RF coil is similarly suspended inside the vibrating magnet shell. This vibration is transmitted to the RF resonator.

In the prior art the transmission of vibration energy to the magnet shell or the RF resonator and noise emission via the magnet shell or via the RF resonator is counteracted by the use of mechanical and/or electromechanical vibration attenuators. Generally these are passive in action, e.g. rubber bearings, or piezo-actuators for example integrated in the gradient coil, which are controlled to produce counteracting vibrations, thereby reducing the vibration amplitude of the gradient coil. Vibration of the magnet shell is generally attenuated by cushions against the gradient coil.

The following passive measures are generally also used to reduce vibration:
  use of thick and heavy materials
  attenuation layers applied from "outside" (e.g. tar)

It is also known that vibration damping can be achieved by inserting sound-absorbing so-called acoustic foams in the area between the carrier tube and the gradient coil.

For example in published patent application EP 1 193 507 A2 the magnet shell of the basic field magnet is coated inside and outside with an acoustically attenuating foam mass and the front face is also provided with noise-attenuating caps. Such encapsulation of the sound-inducing components of an MRT system in particular by means of an inherent shell structure is also disclosed in EP 1 077 382 A2, Patent Abstracts of Japan Vol. 1998, No. 03, 27 Feb. 1998—JP 09 299348 A and in the U.S. Pat. No. 5,084,676. The published patent application DE 198 38 390 A1 discloses an MRT device with a sound attenuation arrangement, by means of which the gradient field magnet system is encapsulated off from the patient. A similar encapsulation is disclosed in EP 0 350 640 A wherein the carrier tube holding the patient is extended axially beyond the gradient field magnet system and at the same time is expanded in a flared manner on both sides. Sound reduction of a different type is achieved according to Patent Abstracts of Japan, Vol. 2000, No. 11, 3 Jan. 2001, JP 2000 232966 A by a special gradient coil design.

Nevertheless the acoustic emission of a current standard MRT device is still very high, particularly in the low frequency (50–200 Hz) range.

SUMMARY OF THE INVENTION

An object of the present invention is to reduce further the noise transmission during operation of an MRT device in the entire relevant frequency range (50–2000 Hz) in a simple and economical manner.

According to the invention this object is achieved by a magnetic resonance tomography device having a toroidal magnet body surrounded by a similarly toroidal magnet shell, which surrounds and defines an inner area in the form of a cylindrical area about the torus axis in the radial center of the magnet shell. The magnet body is disposed in the toroidal inner area of the magnet shell and a gradient coil system arranged on a cylinder surface is disposed in the inner area and an inner encapsulation cylinder is disposed in the radial inner area of the cylinder surface. The magnet shell and the gradient coil system are externally and acoustically sealed from the inner encapsulation cylinder and a capsule, which completely encloses the magnet shell in the radial outer area and is connected to the inner encapsulation cylinder in an acoustically sealed manner, so that acoustic vibrations, which are generated when the gradient coil system is switched and which are transmitted to the magnet shell, do not penetrate into the toroidal outer area, especially into the inner area. The capsule is formed as a three-layer system, wherein the outermost layer is a cover layer, the center layer is a full foam layer and the inner layer is a partial foam layer containing foam patches or foam strips, or the outermost layer is a cover layer, the center layer is a partial foam layer containing foam patches or foam strips, and the innermost layer is a full foam layer.

Both embodiments of the MRT device according to the invention are acoustically identical. The first embodiment of the capsule has the advantage that a partial foam layer configured as the inner layer allows tolerance compensation, as a non-solid layer can adapt more easily to unplanned deformations in the magnet shell. The cover layer advantageously has a high mass per unit area.

Also advantageous is an inventive layer distribution in the capsule such that the full foam layer accounts for $\frac{2}{3}$ and the partial foam layer $\frac{1}{3}$ of the total layer thickness of the system.

One important aspect of the invention is that the surface fill coefficient of the partial foam layer is up to 15% to 25% foam in the form of foam patches and/or foam strips. This takes the resonance of the capsule to below the acoustically relevant range (<50 Hz).

The width of the foam strips and foam patches is advantageously around 5 cm.

For heat dissipation, for example by natural convection, according to the invention the capsule has cutouts at suitable points.

According to the invention such a cutout forms an air bridge in which foam strips with staggered offset teeth produce a labyrinth, through which air can penetrate but acoustic vibration is attenuated.

In an embodiment of the present invention the inner encapsulation cylinder, the center of which, when viewed axially, is a cylindrical RF resonator, is extended overall by cylindrical carrier tube extension disposed behind the gradient coil when viewed radially, so that the carrier tube is longer than the gradient coil. Tongues are attached to the carrier tube extension on the base side.

According to the invention the capsule is flange mounted in an acoustically sealed manner on the tongues and on the carrier tube extension pieces. A tapered expansion of the carrier tube extension pieces is provided in the front area for reinforcing and optical purposes.

To reduce vibration further the outer ends of the carrier tube extension pieces are advantageously provided with reinforcing rings.

The original body coil carrier tube, the carrier tube extension pieces and the tongues form one section.

The outer ends of the tongues are also advantageously provided with reinforcing rings.

In a further embodiment of the invention, the tongues are also reinforced, whereby the additional reinforcement is achieved using further rails.

DESCRIPTION OF THE PREFERRED EMBODIMENTS

Figure 8:
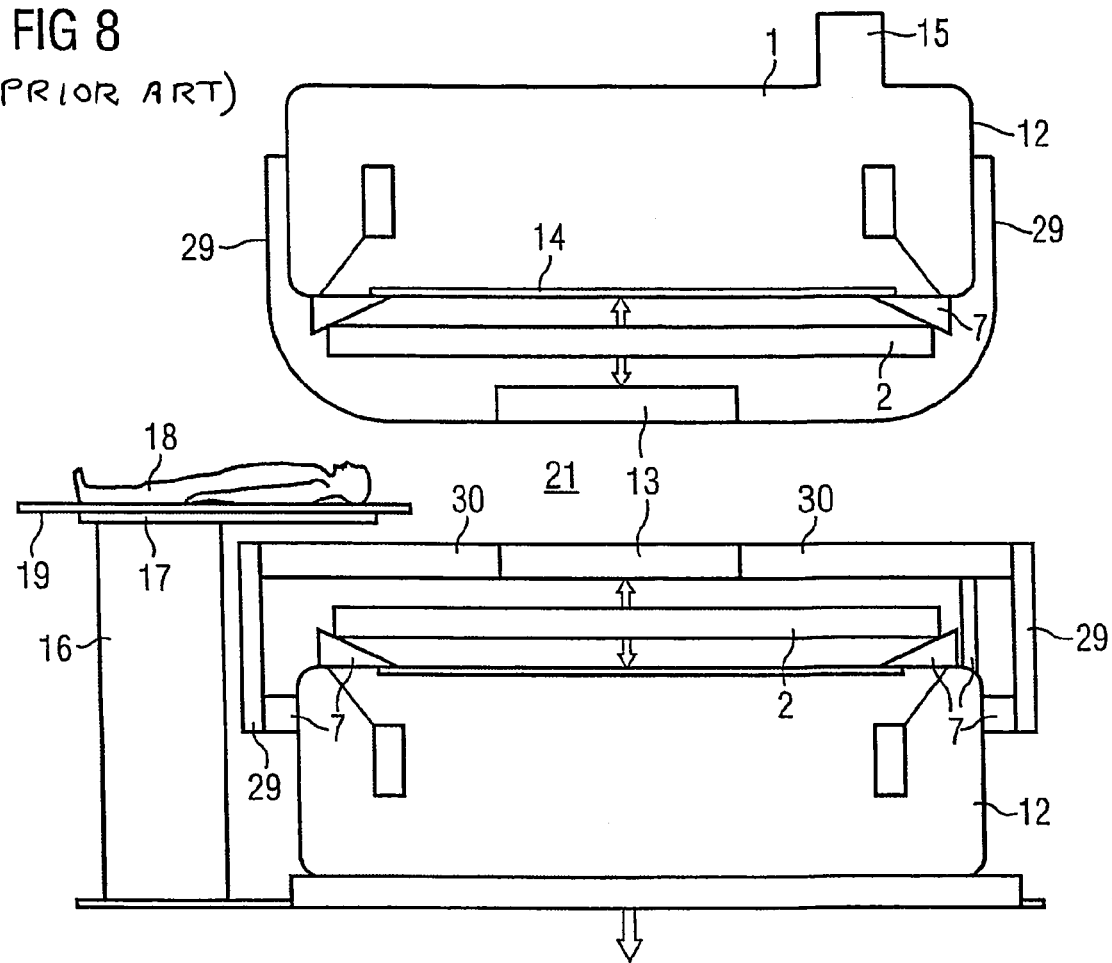
FIG. 8 is a schematic section through the basic field magnet and the components of the inner area enclosed by this according to the prior art.
Figure 9:
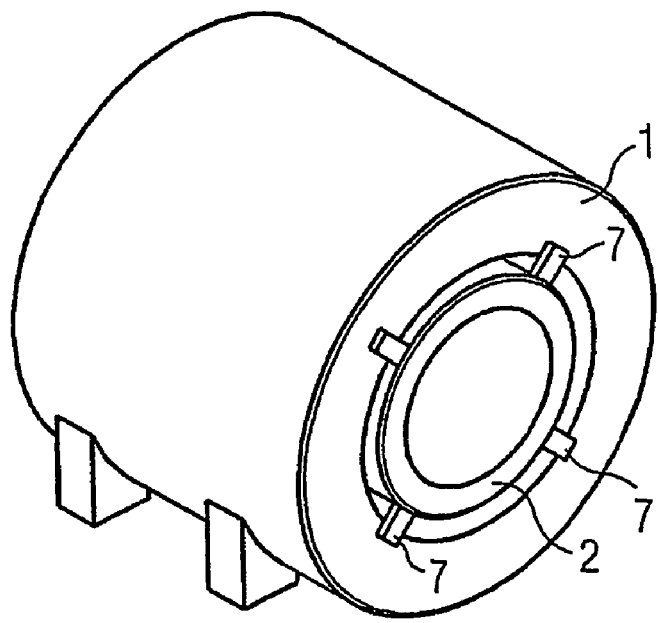
FIG. 9 is a perspective representation of the basic field magnet.
Figure 10:
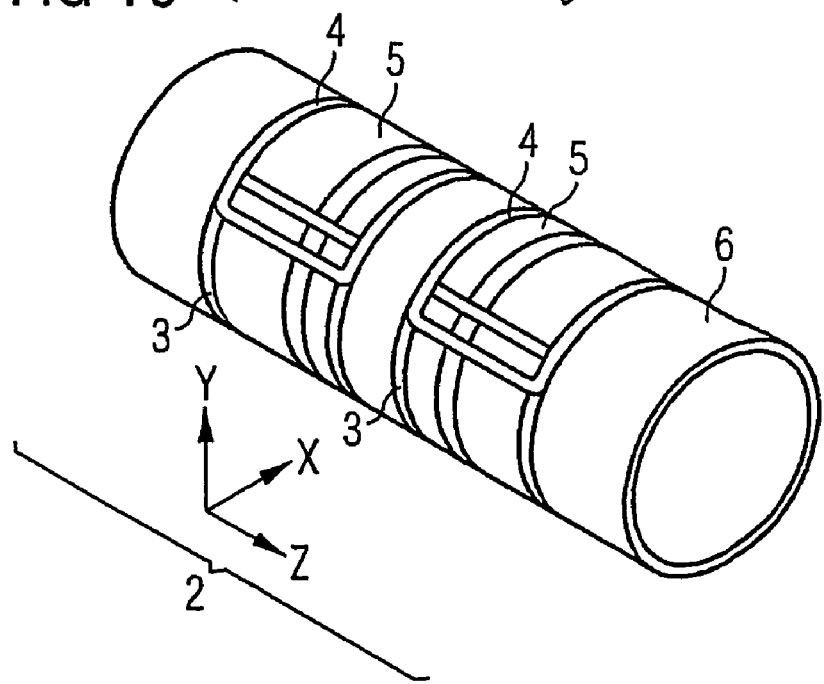
FIG. 10 is a perspective representation of the gradient coil with the three windings.

The principal vibration source or vibration center—apart from the cold head—of a conventional MRT device according to the prior art, as shown for example schematically in FIG. 8, is the gradient coil system 2. The present invention allows noise transmission and noise emission, particularly in the low frequency range (50–200 Hz) to be significantly reduced by three measures or a combination of said three measures.

The measures are:
A) Encapsulation of the magnet shell and gradient coil using a cantilevered layer structure, the structural rigidity of which is less than that of the materials used,
B) Modification of the RF resonator and tongues configured as a body coil (BC),
C) Acoustically optimized configuration of cutouts in the inventive encapsulation.

Figure 1:
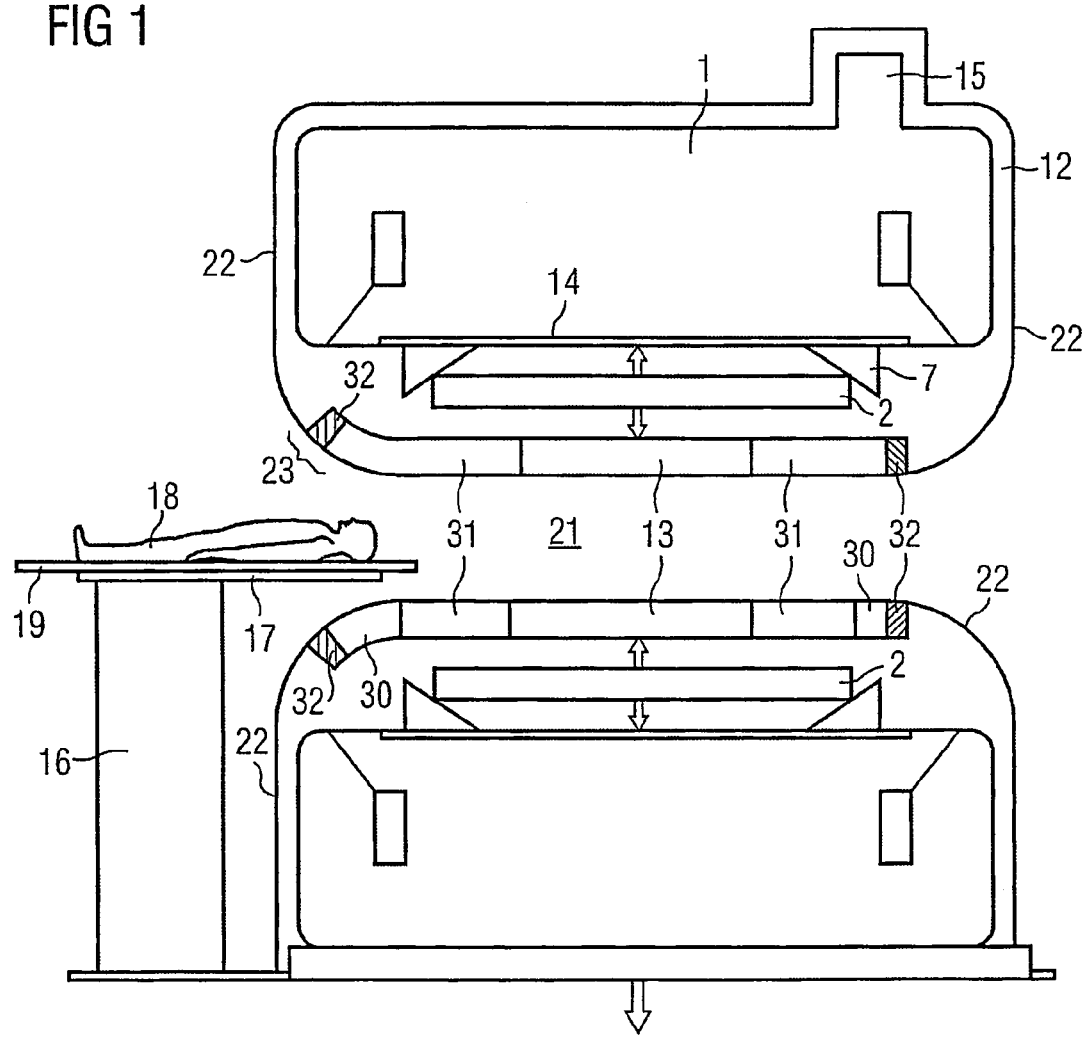
FIG. 1 is a schematic section through the inventively encapsulated basic field magnet and the inventively modified components of the inner area surrounding it.

The above inventive measures result in an inventively modified MRT device, as shown in FIG. 1. The original cladding 29 is replaced by the inventive encapsulation 22, which is connected at an acoustically sealed interface 23 to the BC and encloses the entire magnet shell 12 with its upper and lower sections including the cold head 15 and gradient coil 2. The body coil (BC), originally formed by the cylindrical RF resonator 13 and contiguous tongues 30 in the lower section, has been extended overall by means of carrier tube extension pieces 31—longer than the gradient coil 2 behind it. The tongues 30 are shortened correspondingly.

Figure 2:
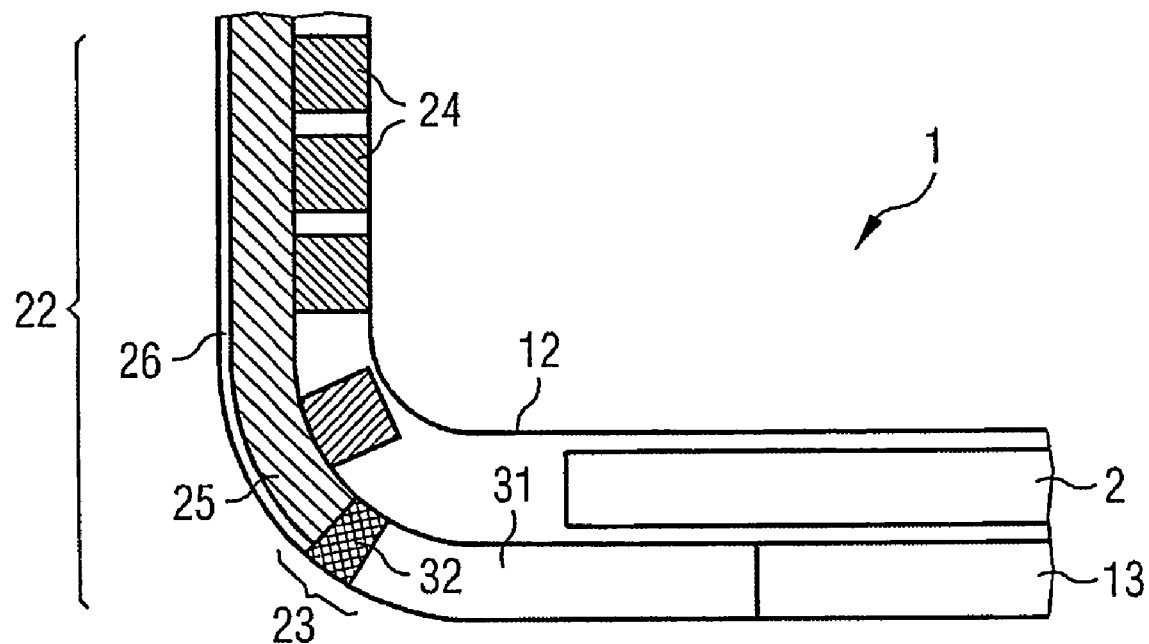
FIG. 2 is a section through the attenuating encapsulation at the interfaces with the inventively modified RF resonator.

The schematic structure of the encapsulation 22 in the area of the reinforcing rings 32 is shown in FIG. 2. The capsule has three layers, an outer cover layer 26 of a material with a high mass per unit area, a first foam layer 25 of the softest possible full foam and a second foam layer 24 of foam strips and/or foam patches of the same material as the first foam layer 25.

The encapsulation 22 is cantilevered but its second foam layer 24 can be in contact, for example, with the magnet shell 12. This second foam layer 24 in combination with the first foam layer 25 and the cover layer 26 produces the structural softness of the entire encapsulation 22, which ensures that the resonance of said encapsulation 22 is at very low frequencies. This prevents an increase in noise in the acoustically relevant frequency range (i.e. >50 Hz) compared for example with pure full foam encapsulation (as tested in the experiment). Such an overall structure 22 thus ensures noise reduction at low (50–200 Hz), average (200–500 Hz) and high (500–2000 Hz) frequencies.

Figure 3:
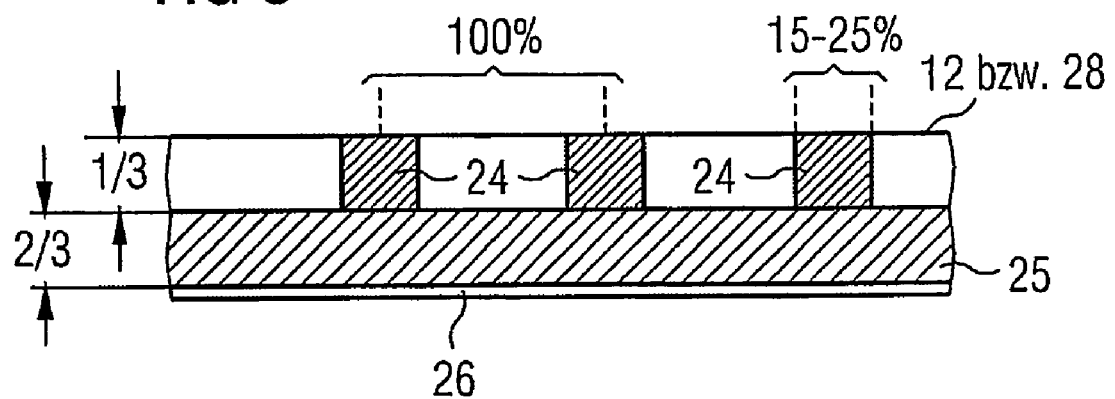
FIG. 3 shows the size ratios of the respective elements in relation to each other by means of a section through the attenuating encapsulation.
Figure 4:
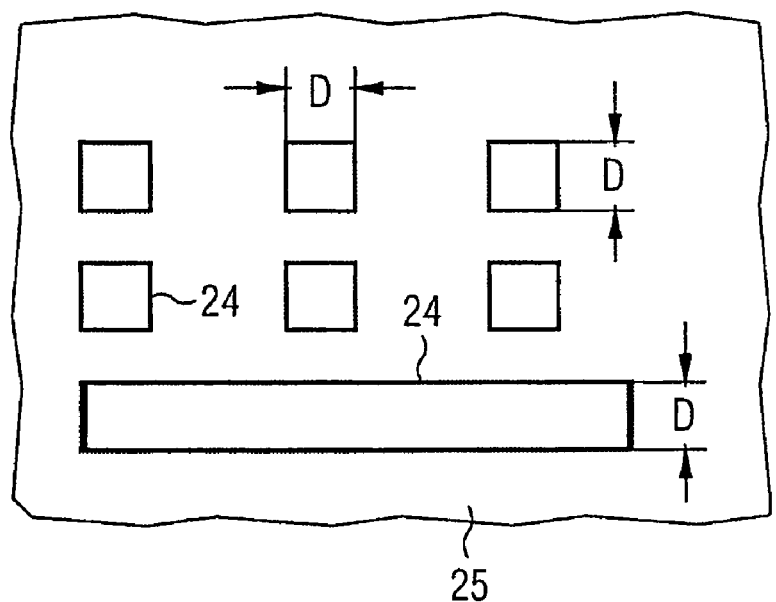
FIG. 4 is a top view of possible internal elements of the encapsulation.

The size distribution or size ratios of the individual components in the capsule 22 are shown in FIGS. 3 and 4. The first foam layer 25 accounts for ⅔ of the total capsule layer 22 and the second foam layer 24 accounts for ⅓. The thickness of the cover layer is negligible. Overall the second foam layer 24 comprises only up to 15–25% foam material. This surface fill coefficient is achieved using foam patches or foam strips, as shown in FIG. 4. The width D of such a foam strip or the side D of such a foam patch is approx. 5 cm.

Figure 7:
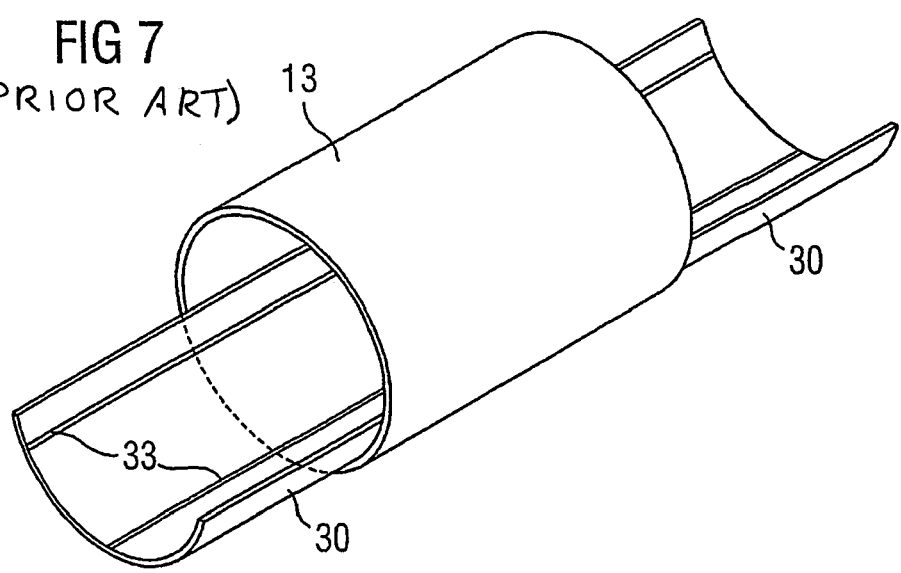
FIG. 7 is a perspective view of an RF resonator according to the prior art.

If a conventional body coil (BC) according to the prior art, embodying the cylindrical RF resonator 13 and contiguous tongues 30 in the lower section (shown respectively in FIG. 7) is used with such an inventive encapsulation, the system still has noise weaknesses at the following points: the upper longitudinal ends of the cylindrical section 13 of the BC have relatively high vibration levels as do the tongues 30, which vibrate significantly due to their considerable length and softness despite two reinforcing rails 33.

Figure 6:
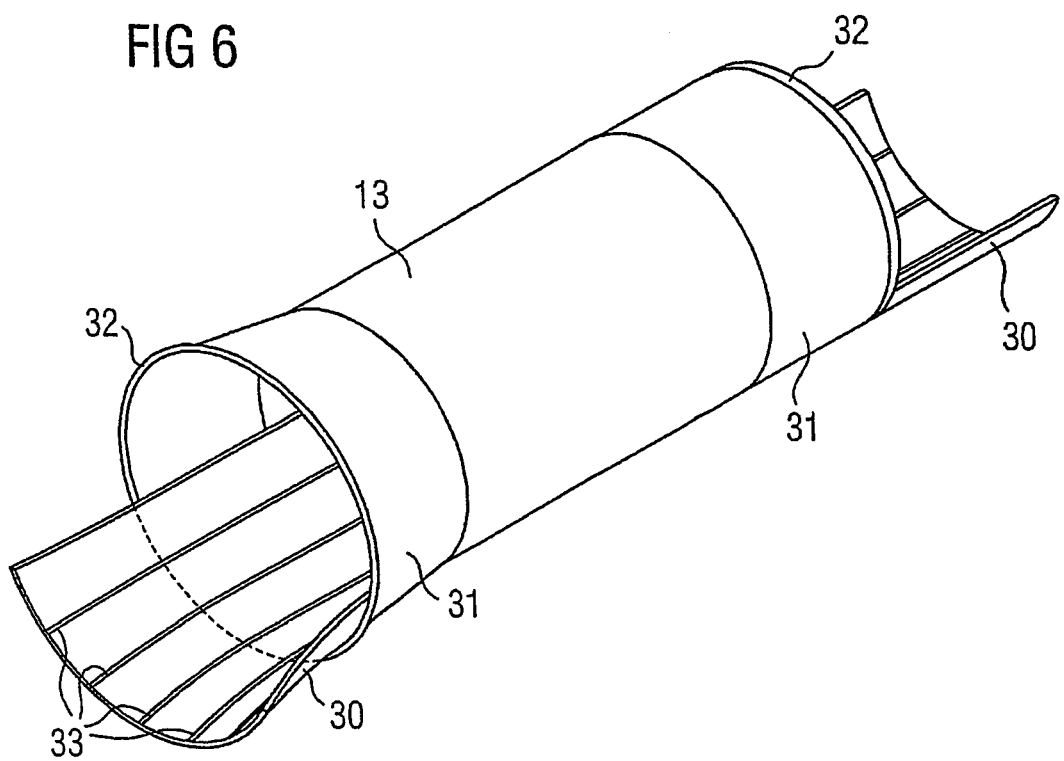
FIG. 6 is a perspective view of an inventively modified RF resonator.

According to the present invention the BC is therefore modified as follows (FIG. 6 shows a perspective view):

The cylindrical section of the BC is extended by means of carrier tube extension pieces 31 so that it is longer overall than the gradient coil 2 behind it. According to the invention the resulting "inner encapsulation cylinder 13, 31" is made of a rigid, thick and heavy material. The tongues 30 are shortened correspondingly. For technical reasons relating to design, the front area of the cylindrical section is expended in a tapered manner and its outer ends are provided with reinforcing rings 32, on which the capsule 22 is flange-mounted in an acoustically sealed manner. The inventive increase in the number of stretcher rails to a total of four reduces the vibration by approximately a factor of 3.

This inventive reconfiguration of the BC allows noise reduction to be achieved at the critical points for noise mentioned above, reducing the noise of the BC overall to a comparable level to that of the entire encapsulation surface.

Overall the invention achieves a reduction in vibration amplitude of the cover layer 26 compared with the vibration amplitude of the unencapsulated magnet shell 12 by a factor of 30 in the overall acoustically relevant range (50–2000 Hz). This is measured with vibration sensors and directional microphones in proximity to the vibrating surfaces.

It is important with such encapsulation that the heat of all the heat-producing components inside the capsule (for example the electronic line at the side of the magnet shell 12) is dissipated to prevent overheating and associated failure. Therefore so-called cutouts have to be created at suitable points on the capsule 22 to allow convection inside so that the above-mentioned components can be cooled.

Figure 5:
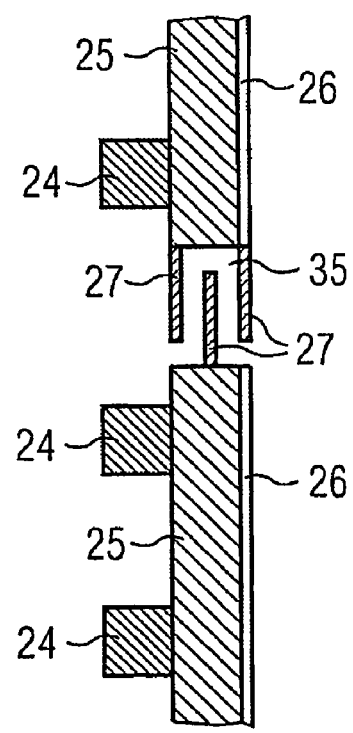
FIG. 5 is a cross-section of an embodiment of a cutout.

Such a cutout according to the present invention is shown in FIG. 5. The inventive encapsulation 22 has a cutout point, which represents an air bridge. To prevent noise transmission at this point, graduated foam strips or foam strips with offset teeth 27 are arranged in the cutout, which attenuate the inward noise in an optimum manner.

Although modifications and changes may be suggested by those skilled in the art, it is the invention of the inventors to embody within the patent warranted heron all changes and modifications as reasonably and properly come within the scope of their contribution to the art.

We claim as our invention:

1. A magnetic resonance tomography device comprising:
   a toroidal magnet shell having a longitudinal axis and surrounding and defining an interior cylindrical volume radially centered with respect to said longitudinal axis;
   a similarly toroidal magnet body disposed in said interior volume;
   an encapsulation cylinder, defining a cylindrical surface of said cylindrical volume;
   a switchable gradient coil system disposed between said cylindrical surface and said magnet body; and
   a capsule completely enclosing a radial outer surface of said magnet shell and connected to said encapsulation cylinder with an acoustically sealed connection for preventing acoustic vibrations, generated during switching of said switchable gradient coil system and transmitted to said magnet shell, from penetrating into said radial outer surface, said capsule comprising a three-layer system having an outermost cover layer, a center layer comprising a full foam layer, and an inner layer comprising a partial foam layer containing foam elements in a form selected from the group consisting of foam patches and foam strips.

2. A magnetic resonance tomography device as claimed in claim 1 wherein said cover layer has a high mass per unit area.

3. A magnetic resonance tomography device as claimed in claim 1 wherein said three-layer system has a thickness, and wherein said full foam layer comprises approximately two thirds of said thickness and wherein said partial foam layer comprises approximately one third of said thickness.

4. A magnetic resonance tomography device as claimed in claim 1 wherein said partial foam layer has a surface fill coefficient in a range between 15% and 25% foam.

5. A magnetic resonance tomography device as claimed in claim 1 wherein said foam elements each have a width of approximately 5 cm.

6. A magnetic resonance tomography device as claimed in claim 1 wherein said capsule comprises cutouts at a plurality of locations therein.

7. A magnetic resonance tomography device as claimed in claim 6 wherein each cutout comprises an air bridge formed by foam strips with graduated offset teach forming a labyrinth, through which air can penetrate but which attenuates acoustic vibration.

8. A magnetic resonance tomography device as claimed in claim 1 comprising a cylindrical RF resonator disposed in a center of said encapsulation cylinder, and comprising cylindrical carrier tube extension pieces giving said RF resonator a longitudinal length that is greater than a longitudinal length of said gradient coil system, and comprising tongues disposed at said extension pieces.

9. A magnetic resonance tomography device as claimed in claim 8 wherein said capsule is flange-mounted with an acoustically sealed connection on said tongues and said extension pieces.

10. A magnetic resonance tomography device as claimed in claim 8 wherein said extension pieces expand in a tapered manner at a front of said encapsulation cylinder.

11. A magnetic resonance tomography device as claimed in claim 8 comprising reinforcing rings disposed at outer ends of said tongues.

12. A magnetic resonance tomography device as claimed in claim 8 comprising additional reinforcement at said tongues.

13. A magnetic resonance tomography device as claimed in claim 12 wherein said additional reinforcement comprises rails.

14. A magnetic resonance tomography device comprising:
   a toroidal magnet shell having a longitudinal axis and surrounding and defining an interior cylindrical volume radially centered with respect to said longitudinal axis;
   a similarly toroidal magnet body disposed in said interior volume;
   an encapsulation cylinder, defining a cylindrical surface of said cylindrical volume;
   a switchable gradient coil system disposed between said cylindrical surface and said magnet body; and
   a capsule completely enclosing a radial outer surface of said magnet shell and connected to said encapsulation cylinder with an acoustically sealed connection for preventing acoustic vibrations, generated during switching of said switchable gradient coil system and transmitted to said magnet shell, from penetrating into said radial outer surface, said capsule comprising a three-layer system comprising and outermost cover layer, a center layer comprising a partial foam layer containing foam elements in a form selected from the group consisting of foam patches and foam strips, and an innermost layer comprising a full foam layer.

15. A magnetic resonance tomography device as claimed in claim 14 wherein said cover layer has a high mass per unit area.

16. A magnetic resonance tomography device as claimed in claim 14 wherein said three-layer system has a thickness, and wherein said full foam layer comprises approximately two thirds of said thickness and wherein said partial foam layer comprises approximately one third of said thickness.

17. A magnetic resonance tomography device as claimed in claim 14 wherein said partial foam layer has a surface fill coefficient in a range between 15% and 25% foam.

18. A magnetic resonance tomography device as claimed in claim 14 wherein said foam elements each have a width of approximately 5 cm.

19. A magnetic resonance tomography device as claimed in claim 14 wherein said capsule comprises cutouts at a plurality of locations therein.

20. A magnetic resonance tomography device as claimed in claim 19 wherein each cutout comprises an air bridge formed by foam strips with graduated offset teach forming a labyrinth, through which air can penetrate but which attenuates acoustic vibration.

21. A magnetic resonance tomography device as claimed in claim 14 comprising a cylindrical RF resonator disposed in a center of said encapsulation cylinder, and comprising cylindrical carrier tube extension pieces giving said RF resonator a longitudinal length that is greater than a longitudinal length of said gradient coil system, and comprising tongues disposed at said extension pieces.

22. A magnetic resonance tomography device as claimed in claim 14 wherein said capsule is flange-mounted with an acoustically sealed connection on said tongues and said extension pieces.

23. A magnetic resonance tomography device as claimed in claim 21 wherein said extension pieces expand in a tapered manner at a front of said encapsulation cylinder.

24. A magnetic resonance tomography device as claimed in claim 21 comprising reinforcing rings disposed at outer ends of said tongues.

25. A magnetic resonance tomography device as claimed in claim 21 comprising additional reinforcement at said tongues.

26. A magnetic resonance tomography device as claimed in claim 25 wherein said additional reinforcement comprises rails.

* * * * *